United States Patent [19]
Chapman

[11] Patent Number: 4,682,121
[45] Date of Patent: Jul. 21, 1987

[54] PHASE DISCRIMINATOR AND DATA STANDARDIZER

[75] Inventor: Dale B. Chapman, San Jose, Calif.

[73] Assignee: International Business Machines Corporation, Armonk, N.Y.

[21] Appl. No.: 698,105

[22] Filed: Feb. 4, 1985

[51] Int. Cl.[4] .......................... H03L 7/02; H03D 3/18
[52] U.S. Cl. .................................. 331/1 A; 307/516; 328/133; 329/50; 329/122; 331/17; 331/23; 331/27; 375/81; 375/94; 375/120
[58] Field of Search .............. 307/514, 516; 328/133, 328/134; 329/50, 122; 331/1 A, 14, 17, 23, 27; 375/80, 81, 94, 120

[56] References Cited

U.S. PATENT DOCUMENTS

| | | | |
|---|---|---|---|
| 3,614,635 | 10/1972 | LaPine et al. | 328/155 |
| 3,644,910 | 2/1972 | Smith | 340/174.1 H |
| 3,701,039 | 10/1972 | Lang et al. | 331/1 A |
| 3,825,770 | 7/1974 | Hampel | 307/203 |
| 3,872,396 | 3/1975 | Bastide et al. | 331/1 A |
| 4,034,309 | 7/1977 | Vaughn | 331/1 A |
| 4,039,859 | 8/1977 | Horninger | 307/232 |
| 4,105,947 | 8/1978 | Crowley | 331/1 A |
| 4,123,704 | 10/1978 | Johnson | 324/78 Z |
| 4,128,812 | 12/1978 | Pavlis | 328/134 |
| 4,131,809 | 12/1978 | Baars | 307/303 |
| 4,148,080 | 4/1979 | Ragle et al. | 360/51 |
| 4,191,976 | 5/1980 | Braun | 375/120 X |
| 4,200,845 | 4/1980 | Mendenhall et al. | 331/1 A |
| 4,237,387 | 12/1980 | Devendorf et al. | 307/203 |
| 4,267,514 | 5/1981 | Kimsey | 328/133 |
| 4,291,274 | 9/1981 | Suzuki et al. | 328/133 |
| 4,357,707 | 12/1982 | Delury | 375/119 |
| 4,359,653 | 11/1982 | Takamasa | 307/455 |
| 4,362,957 | 12/1982 | Stern | 307/527 |
| 4,430,608 | 2/1984 | Nesler | 323/282 |
| 4,442,406 | 4/1984 | Voss | 328/134 |
| 4,459,623 | 7/1984 | Glenn, II et al. | 360/43 |
| 4,527,079 | 7/1985 | Thompson | 307/475 |
| 4,527,277 | 7/1985 | Kosaka et al. | 307/516 X |

OTHER PUBLICATIONS

Integrated Electronics, McGraw-Hill, 1972, pp. 136–139 and pp. 167–169.
"CMOS PHASE-LOCKED LOOPS," Solid State Scientific, SCL40468 88340468 SCL44468 883/44468, pp. 116–119.
"Disk-Separator IC Eases Encoding/Decoding Tasks" by Herb Schneider, EDN Magazine, DP8460, Aug. 1983.
Data Sheet for Motorola MC4344/MC4044 Phase-Frequency Detector, 6367248 Motorola Semiconductor, pp. 7-25 to 7-42.
Product Sheet for Texas Instruments Types SN54LS297, SN74LS297 Digital Phase-Locked-Loop Filters, 8961721 Texas Instruments, Inc., Jan. 1981, pp. 38–39.
Product Sheet for Texas Instruments, Inc. 8961721, "Digital Phase-Locked Loop Design Using SN54/74LS297" by Donald G. Troha, pp. 1–10.
IBM Technical Disclosure Bulletin, vol. 23, No. 10, Mar. 1981, "Formatting Of Variable Length (CKD) Records on DASD Tracks Having Periodically Occurring Unwritable Segments" by Dishon and Schor, p. 4697.

*Primary Examiner*—Eugene R. LaRoche
*Assistant Examiner*—James C. Lee
*Attorney, Agent, or Firm*—Brown, Martin Haller & Meador

[57] ABSTRACT

A phase discriminator and data standardizer apparatus measures phase difference between a data signal obtained from a magnetic disk device and a variable-frequency reference data clock. From the measured phase difference, the apparatus develops a phase difference signal used to adjust the frequency of the reference data clock in order to reduce the phase difference. The apparatus includes a multi-state latch circuit that responds to the input data and clock signals by measuring the phase in a phase measurement transition cycle in which only one state variable changes at a time and producing the phase difference signal based upon the measurement. A gate responds to the measurement transition cycle by producing the phase difference signal. The apparatus further standardizes the input data so as to provide the data in a format that is predictably standardized in its time relationship to the reference data clock signal.

20 Claims, 6 Drawing Figures

PHASE DISCRIMINATOR AND DATA STANDARDIZER

BACKGROUND OF THE INVENTION

This invention concerns a phase discriminator and data standardizer that detects the difference in phase between an input data signal and a variable-frequency reference data clock signal and produces an output for changing the frequency of the clock signal to reduce the measured phase difference, while also providing the input data as an output in a standardized format that is synchronized with the reference data clock.

Disk file systems are conventionally used as information storage adjuncts to computer systems. In a disk file storage system, data is recorded by flux reversals placed on the surface of a magnetic disk. The information content of the data lies in the time separating any two flux reversals. To obtain information previously recorded on a disk, the time between two flux reversals must be accurately measured to allow the information to be retrieved. The instantaneous frequency of the data read from a disk varies due to variation in the rotational velocity of the disk. In systems where the data is provided by the disk file system to another apparatus in synchronism with a data clock, means must be provided for varying the frequency of the data clock in a closed loop operation to track any variations in input data speed resulting from changes in the rotational velocity of the disk. Further, the data must be standardized to provide an output that has a predictable time relationship to the reference data clock signal.

In a disk file storage system, the reference data clock is normally produced by a phase-locked loop including a voltage controlled oscillator (VCO) whose frequency is controlled by a phase discriminator that compares the phase relationship of the reference data clock to the phase of the incoming data pulses. Typically, such a phase discriminator, after detecting a phase difference, causes the frequency of the VCO to be varied incrementally to align the phase of the clock and data signals.

The exact placement of magnetic transitions on a disk can be altered in time relative to adjacent transitions. Such positional variations can result from imperfections in the recording medium, flux leakover from adjacent transitions, and noise and imperfections in the detection process. As a result, the digital data pulses derived from the flux transitions will not have a predictable position relative to the reference data clock. Therefore, a data standardizer must make a precise determination of which clock cycle a data pulse occurs in and produce as an output a pulse that occurs in a manner that is predictably standardized in its time relationship to the reference data clock.

Existing phase discriminators employed to detect the difference in phase between a data signal and a reference data clock signal typically employ circuitry that is sensitive to race conditions in that a plurality of circuit transitions must be made in parallel. A variation in the relative delays of these parallel transitions can produce unwanted variations in the phase discrimination and data standardization processes.

As the speeds of data transfer and data processing equipments increase with each new generation of computers, the destabilizing effects of multiple path conditions on phase detection will only grow in magnitude. Reduction of race conditions will enhance the ability of phase detectors to synchronize data obtained from a disk file system with a data clock signal and to standardize the data in a predictable manner.

SUMMARY OF THE INVENTION

The present invention is a phase discriminator and data standardizer apparatus that suppresses the occurrence of multiple path conditions in a phase discriminator used to detect phase difference between an input data signal and a variable-frequency reference data clock signal. The operation of the apparatus is characterized by the absence of multiple path conditions in the phase measuring circuitry of the apparatus.

In eliminating multiple path conditions, the apparatus of the invention employs a multi-state latching circuit that measures relative phase between the data and clock signals by following a state transition path in which each state transition results from the change of only one respective state variable.

The invention further extracts information embedded in the data signal and provides the information in a format that is predictably standardized and synchronized with the reference data clock signal.

The phase discriminator and data standardizer apparatus of the invention is responsive to the difference in phase between an input data signal having transitions which occur at a nominal data rate and a variable-frequency clock signal. In response to the detection of a phase difference between the input data and reference data clock signals, the apparatus produces a phase difference signal for changing the frequency of the clock signal in a direction tending to eliminate the phase difference. The apparatus includes a reference timing circuit responsive to a transition of the input data signal for producing a timing reference signal that has a particular reference timing period.

The latch circuit of the apparatus responds to the timing reference signal and to a transition of the reference clock signal by, if the clock transition occurs after completion of the timing reference signal, providing a first phase difference signal indicating that the clock is late relative to the data signal and corresponding to the time by which the timing reference signal precedes the clock transition. If the clock transition occurs during the timing reference signal, the discriminator provides a second phase difference signal indicating that the clock is early relative to the data signal and corresponding to the portion of the reference timing period remaining after the clock transition.

A gate circuit is provided that responds to the first phase difference signal by producing an increase signal to increase the reference data clock frequency. The gate further responds to the second phase difference signal by producing a decrease signal to decrease the reference data clock frequency.

Also included in the apparatus of the invention is a gate responsive to the latch circuit for providing information contained in the input data signal in a standardized data format that corresponds in phase with the corrected reference data clock signal.

It is therefore a principle objective of the present invention to provide a phase discriminator and data standardizer apparatus in which race conditions are substantially eliminated.

It is a further objective of the present invention to provide such an apparatus having a latch circuit that measuressa phase difference between an input data signal and a reference data clock signal and produces a phase difference signal based on the measurement by performing a multi-state measuring cycle in which each state transition results from the change of a single respective state variable.

A still further objective of the present invention is to provide such an apparatus having a data standardizer that provides information contained in the input data signal in a standardized data format that is synchronized with the reference data clock signal.

A still further objective of the present invention is to provide an improved apparatus for performing phase discrimination and data standardization.

These and other objectives and advantages of the present invention will become more apparent when the following detailed description is read in conjunction with the below-described drawings, in which like reference numerals indicate like elements.

DETAILED DESCRIPTION OF THE PREFERRED EMBODIMENT

The phase discriminator and data standardizer of the invention performs frequency synchronization and data standardization necessary in a binary data processing system wherein a clock signal must be synchronized to an incoming data signal, a determination made as to which cycle of the clock the incoming data signal falls in, and the data provided in a standardized format.

The phase discriminator and data standardizer apparatus of the invention (referred to hereinafter as the apparatus, or the apparatus of the invention) is intended for use in a disk file storage system wherein data is retrieved or read from a spinning magnetic disk. The data is provided, by way of a pulse shaping circuit, to a phase-locked loop. The phase-locked loop produces a variable frequency clock signal that is synchronized with the data and provided, together with the data, to a computer system. Such a phase-locked loop is illustrated in FIG. 1 and includes a voltage controlled oscillator (VCO) 10 that produces a reference data clock ($f_C$), the frequency of which is determined by the magnitude of a voltage signal provided by a conventional charge pump 12 through a low pass filter (LPF) 13.

Charge pumps are known in the art, and the one indicated by reference numeral 12 is typical. The charge pump 12 includes a source of charging voltage current $I_C$ and a source of discharging current $I_D$. The current sources are switched, alone or together, to a charge-storing capacitor network that forms the LPF 13. When the $I_C$ current source is switched by a phase correction signal to the LPF 13, the charging current increases the charge on the network. The increase in charge increases the magnitude of the voltage provided to the VCO, thereby increasing the frequency of $f_C$. Another phase LPF 13 correction signal causes the discharge current $I_D$ to be switched to the LPF 13. When the discharge current is switched to the LPF 13, it removes charge from the network, thereby reducing the frequency of $f_C$.

In a typical phase-locked loop, the charge pump 12 is fed by a phase discriminator that produces a pair of phase correction signals, one to increase the charge held by the LPF (and thus the frequency of $f_C$). The other LPF correction signal is produced by the phase discriminator to decrease the LPF voltage and, with it, the frequency of $f_C$.

Figure 1:
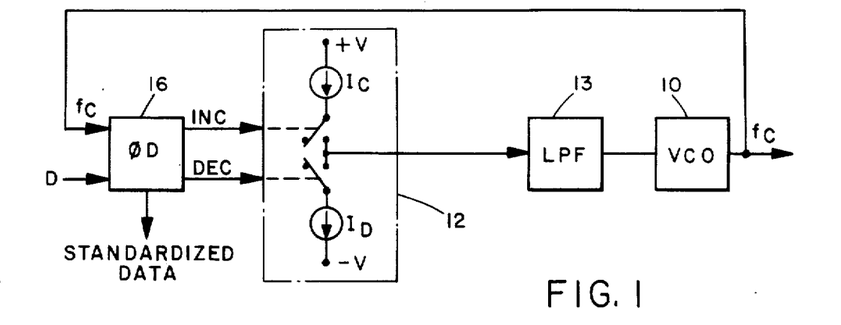
FIG. 1 is a combined schematic and block diagram illustrating a representative application of the phase discriminator and data standardizer of the invention.

The apparatus of the invention, indicated by reference numeral 16 in FIG. 1, accepts as inputs the clock signal $f_C$ and an input data stream D. The apparatus 16 also produces as outputs an increase (INC) correction signal and a decrease (DEC) correction signal. When the INC signal is provided to the charge pump 12, the charge current $I_C$ is connected to the LPF 13. When the INC signal is placed in its negative state, the charge current is removed. Similarly, when the DEC signal is in its positive state, the discharge current $I_D$ is connected to the LPF 13 and, when the DEC signal goes negative, the discharge current is removed from the LPF.

Preferably, D represents data read from a magnetic disk. As is known, data is stored on such a disk in the form of magnetic flux transitions. Information is represented by the distance between successive transitions. When read from the disk, sequential transitions are sensed and fed to a pulse circuit, which produces a pulse for each transition. In the discussion following, D represents the output of such a pulse circuit. The information carried by D corresponds to the time that elapses between the rising edges of successive pulses.

The apparatus 16 also provides, as an output, information obtained from the input data signal D. The apparatus places the information in a standardized format that is synchronized with $f_C$. This output is indicated in FIG. 1 by the signal lead STANDARDIZED DATA.

Figure 2:
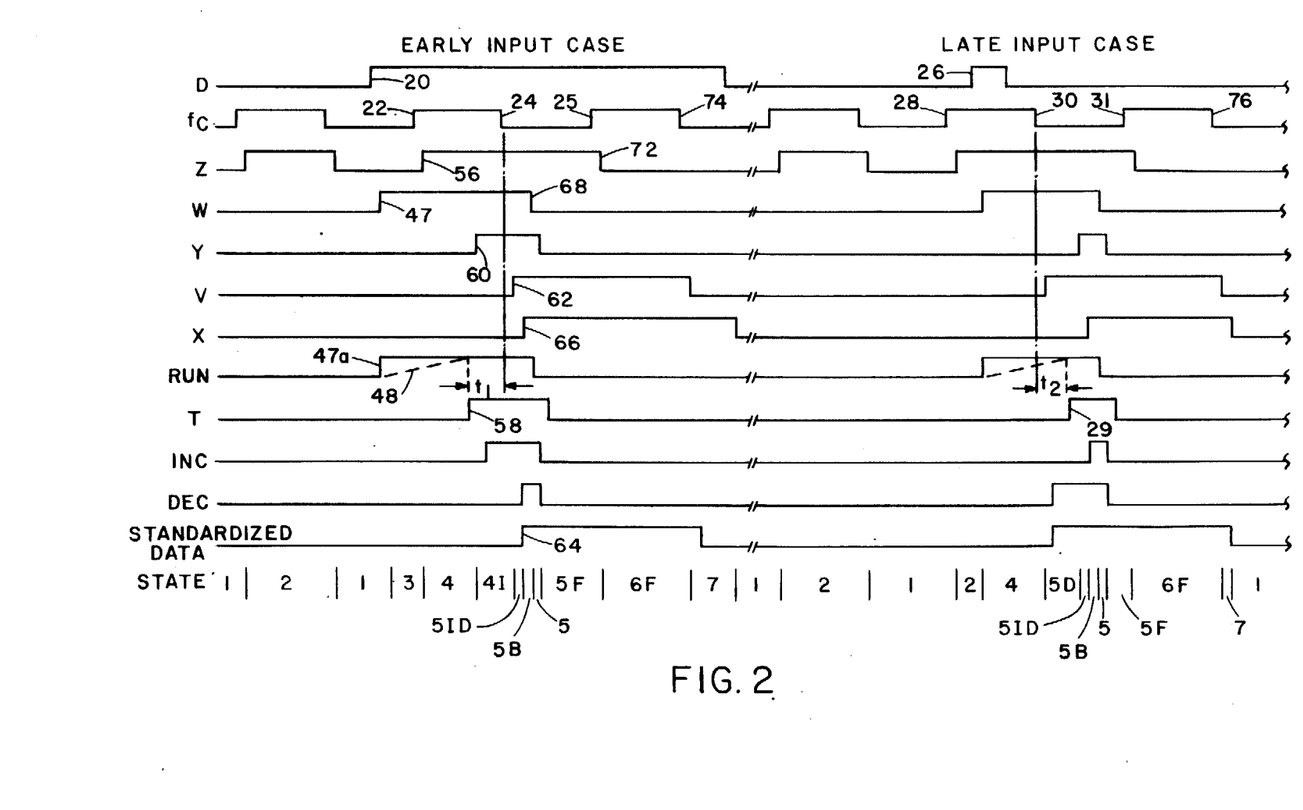
FIG. 2 is a waveform diagram illustrating the timing relationships between the various elements of the phase discriminator and data standardizer of the invention.

The operation of the apparatus 16 is illustrated by waveforms in the waveform diagram of FIG. 2. In FIG. 2, $f_C$ represents the clock signal that is produced by the VCO 10.

The waveform D of FIG. 2 represents the data input to the apparatus 16.

In the portion of FIG. 2 entitled EARLY INPUT CASE, the positive transition 20 of D precedes the positive transition 22 of $f_C$. This constitutes a condition where the input data signal leads $f_C$. In the operation described below, the transition 20 will initiate the operation of a timer that produces a pulse defining a predetermined reference timing period, in this case ½ of the period of a cycle of $f_C$. Thus, if the edges 20 and 22 were aligned, the reference timing signal timing period would begin simultaneously with the transition 22 of $f_C$ and end with the following negative transition 24. Stated differently, the end of the timing period defines where the negative transition 24 would be if $f_C$ and D were in phase. However, since the transition 20 of D precedes the transition 22 of $f_C$, the timing period will end before the negative transition 24 of $f_C$. The time between the ending of the timing reference signal period and the negative transition 24 ($t_1$ in FIG. 3) represents the phase difference between $f_C$ and D. It is this difference that is measured by the apparatus 16, and which the apparatus uses to produce an INC signal.

In the apparatus of the invention, the INC signal alone is enabled for the period of time $t_1$ corresponding to the measured phase difference. In this case, the charge pump will direct current into the LPF 13 so as to raise the magnitude of the voltage provided to the VCO 10. The increase in magnitude will increase the frequency of $f_C$ so that transition 25 and all succeeding transitions that occur before the next phase measurement cycle will tend to move forward in time in an attempt to "catch up" with the phase of D.

After the INC signal has been positive for the time $t_1$, the apparatus 16 turns on the DEC signal to neutralize the INC signal and effectively stop the charge pump changing the voltage to the VCO.

Referring now to the portion of FIG. 2 entitled LATE INPUT CASE, the positive transition 26 of D follows the positive transition 28 of $f_C$, which will lead the apparatus 16 to measure a phase difference to the time that elapses between the negative transition 30 of $f_C$ and the end of the timing reference signal. This measured phase difference corresponds to $t_2$ in FIG. 2. In order to slow $f_C$ down and diminish the phase difference, the apparatus 16 will produce the DEC signal for an amount of time $t_2$ equal to the phase difference. This causes the charge pump 12 to reduce the charge of the LPF 13 so as to reduce the voltage provided to the VCO 10 and hence decrease the frequency of $f_C$. The effect of reducing the frequency of $f_C$ will be to retard the phase of $f_C$.

Again, the apparatus 16 stops the charge pump voltage from changing by causing the INC signal to assume a positive state after the DEC signal has been on for the time $t_2$ corresponding to the measured phase difference. This neutralizes the DEC signal and stops the charge on the LPF 13 changing.

The procedure of turning on the unactivated INC or DEC correction signal after the other correction signal has been in a positive state for a time corresponding to a measured phase difference permits the phase discriminator operation of the apparatus 16 to be terminated without transitioning through the well known "deadband region". The deadband region results from the finite time required to switch the charge pump current circuits. As shown in FIG. 2, after providing both correction signals in their positive states for an amount of time, the apparatus 16 will deactivate them simultaneously.

Figure 3:
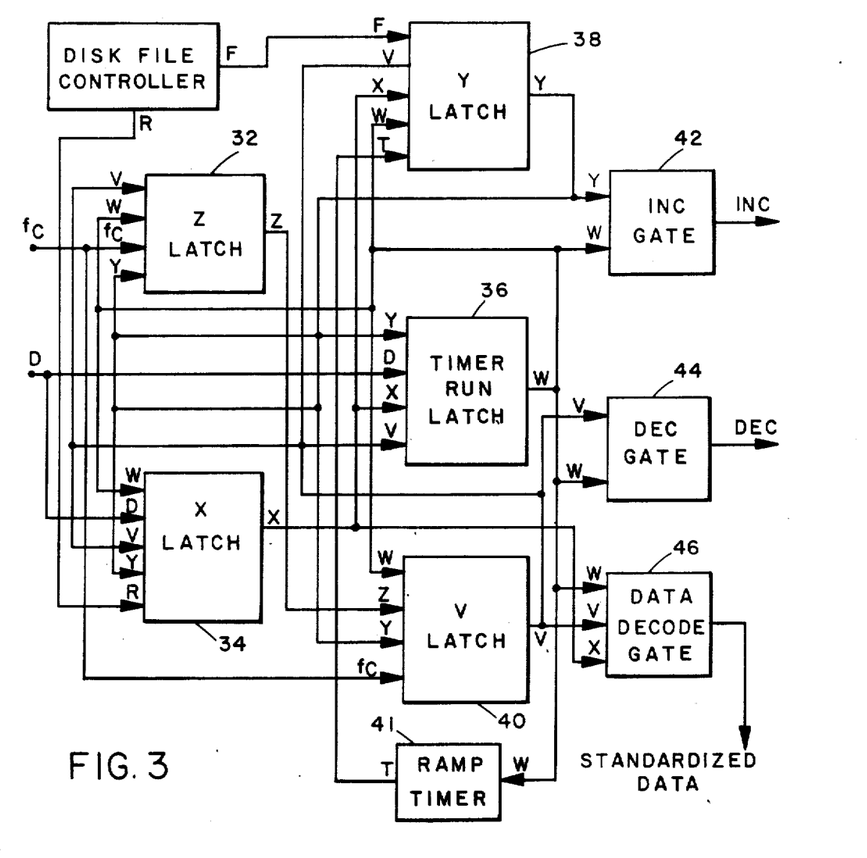
FIG. 3 is a block diagram of the phase discriminator and data standardizer of the invention together with a disk file controller.

The apparatus of the invention includes the elements indicated by reference numerals 32–46 shown in FIG. 3. It does not include the block labelled DISK FILE CONTROLLER. The apparatus includes a multi-state latch circuit that embraces the latches 32–40. The latch circuit transitions through a multi-state phase measurement and frequency adjustment cycle. The latches 32–40 are referred to hereinafter by the designation given their respective outputs or by their assigned reference numerals.

A ramp timer 41 is enabled by the output W of the TIMER RUN latch 36. The ramp timer is conventional. When W is set, a ramp generator, not illustrated, in the timer produces a ramp whose duration is equal to the reference timing period. When the ramp ends, the timer 41 produces a signal T marking the end of the reference timing period. Thus, the time between a positive transition of W and the following transition of T is equal to the reference timing period.

The outputs of the latches 32, 34, 36, 38, and 40 and the output of the ramp timer 41 are labelled Z, X, W, Y, V, and T, respectively. These outputs, together with $f_C$ and D, comprise the state variables that control the transition of the apparatus 16 through its phase measurement cycle. The other state variables F and R are provided to the latches 38 and 34, respectively, for purposes described below. In a disk file system, F and R would be conventionally provided by a disk file controller, which is illustrated in FIG. 2, but which is not a part of the apparatus of the invention.

As illustrated in FIG. 3, the output Z of the latch 32 is determined by the state variables V, W, $f_C$, and Y. The output X of the latch 34 depends upon the state variables W, D, V, Y, and R. The output W of the TIMER RUN latch 36 is dependent upon the condition of state variables Y, D, X, and V. The variable Y provided by the latch 38 is determined by the state variables F, V, X, W, and T. It should be noted that, during a normal phase measurement cycle, the state variables F and R will be disabled. The variable V output by the latch 40 depends upon the condition of the state variables W, Z, Y and $f_C$.

The INC and DEC correction signals are provided by an INC gate 42 and a DEC gate 44. The INC signal output by the INC gate 42 depends upon the state variables Y and W that are input to the gate. The DEC signal output by the DEC gate 44 is determined by the state variables V and W.

The standardized data provided by the apparatus is produced by a DATA DECODER gate 46 that responds to state variables W, V, and X.

Figure 4:
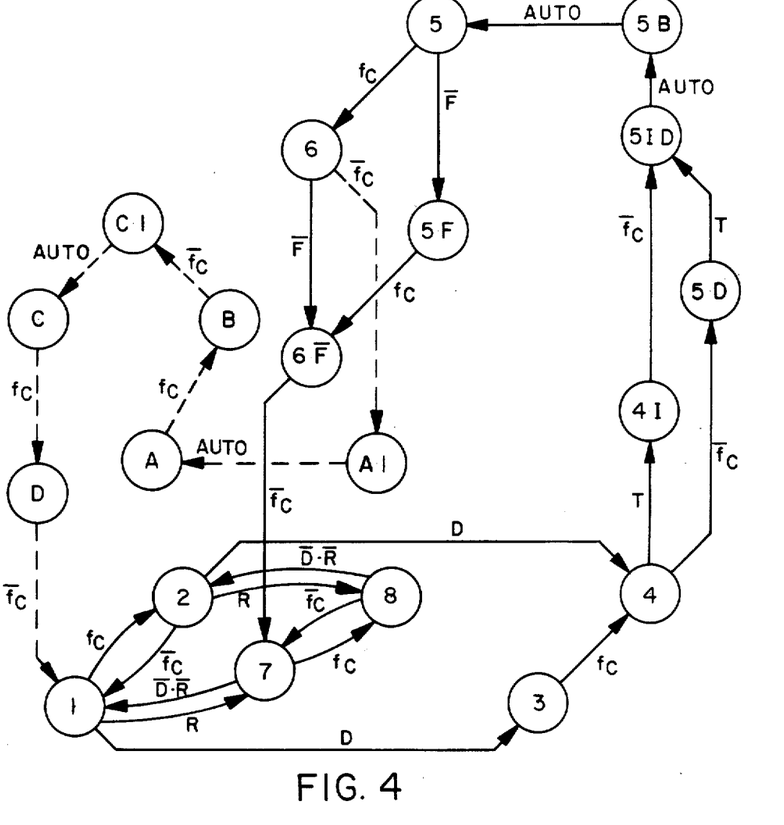
FIG. 4 is a state transition diagram illustrating the operation of the phase discriminator and data standardizer of FIG. 3.

The operation of the apparatus 16 illustrated in FIG. 3 can be understood with reference to the timing diagram of FIG. 2 and the state transition diagram of FIG. 4, the logic equation of Table II, and the equations (1), (2) and (3) that follow. Each state of the FIG. 4 diagram is determined by a particular combination of the state variables produced by the latch circuit. The state sequences of the FIG. 3 apparatus for the early and late arrivals of FIG. 2 are shown at the bottom of FIG. 2 beneath the STANDARDIZED DATA waveforms.

Table I associates the states of FIG. 4 with determining latch states made up of the V, W, X, Y and Z state variables.

TABLE I

| LOGIC STATES | |
|---|---|
| STATE NAME | LATCH STATES |
| 1 | $\overline{V}\overline{W}\overline{X}\overline{Y}\overline{Z}$ |
| 2 | $\overline{V}\overline{W}\overline{X}Y\overline{Z}$ |
| 3 | $\overline{V}\overline{W}X\overline{Y}\overline{Z}$ |
| 4 | $\overline{V}\overline{W}XY\overline{Z}$ |
| 4I | $\overline{V}\overline{W}XYZ$ |
| 4 | $\overline{V}W\overline{X}Y\overline{Z}$ |
| 5B | $VWXY\overline{Z}$ |
| 5D | $VW\overline{X}Y\overline{Z}$ |
| 5F | $V\overline{W}XY\overline{Z}$ |
| 5ID | $VW\overline{X}YZ$ |

TABLE I-continued

| LOGIC STATES | |
|---|---|
| STATE NAME | LATCH STATES |
| 6 | $V\overline{W}X\overline{Y}\overline{Z}$ |
| 6F | $\overline{V}\overline{W}X\overline{Y}\overline{Z}$ |
| 7 | $\overline{V}\overline{W}X\overline{Y}Z$ |
| 8 | $\overline{V}\overline{W}\overline{X}\overline{Y}Z$ |
| A | $\overline{V}\overline{W}\overline{X}YZ$ |
| A1 | $V\overline{W}\overline{X}YZ$ |
| B | $V\overline{W}XYZ$ |
| C | $VWXYZ$ |
| C1 | $VW\overline{X}YZ$ |
| D | $VW\overline{X}\overline{Y}Z$ |

In Table I, conventional digital notation is used for the state variables. Thus, for example, the latch circuit of the apparatus 16 is in state 1 when all of the latches 32–40 are reset. Similarly, the latch circuit is in state 5B when all of the latches 32–40 are set. As will be understood by those skilled in the art, the reset state of a state variable is indicated by a bar over the variable, while the set state is indicated by the absence of a bar.

The conditions for setting and resetting the latches 32–40 are given in Table II.

TABLE II

| SET CONDITIONS | RESET CONDITIONS |
|---|---|
| $V = Z \cdot ((W \cdot f_C) + (\overline{W} \cdot Y \cdot f_C))$ | $V = (W \cdot Z \cdot f_C)$ |
| $W = (\overline{V} \cdot D \cdot \overline{X} \cdot \overline{Y})$ | $\overline{W} = X$ |
| $X = (V \cdot W \cdot Y) + (V \cdot \overline{W} \cdot \overline{Y} \cdot R)$ | $\overline{X} = (\overline{V} \cdot \overline{Y} \cdot \overline{D} \cdot \overline{R}) + (\overline{V} \cdot Y)$ |
| $Y = (W \cdot T)$ | $\overline{Y} = (V \cdot \overline{W} \cdot X \cdot \overline{F}) + (\overline{V} \cdot \overline{W} \cdot X)$ |
| $Z = (\overline{V} \cdot f_C)$ | $\overline{Z} = (\overline{V} \cdot \overline{W} \cdot \overline{Y} \cdot f_C) + (V \cdot f_C)$ |

Again, the notation of the state variables equations in Table II is conventional and equivalent to that utilized in Table I.

The phase correction signals output by the apparatus 16 are given by equations (1) and (2).

$$INC = (W \cdot Y) \quad (1)$$

$$DEC = (V \cdot W) \quad (2)$$

As is evident, the variable terms of equations (1) and (2) are the phase difference signals produced by the action of the latch circuit. The first phase difference signal (W·Y) represents, in time, the magnitude of the phase by which D leads $f_C$. Conversely, the second phase difference signal (V·W) represents, in time, the magnitude of phase difference between $f_C$ and D when $f_C$ leads D.

The output of the DATA DECODE latch 46 is given in equation (3).

$$OUT = (V \cdot W) + (V \cdot \overline{W} \cdot X) \quad (3)$$

In equation (3), the term OUT corresponds to the standardized data output by the DATA DECODE gate 46.

Finally, the waveform labelled RUN in the FIG. 2 waveform drawing is equivalent to the variable W output by the TIMER RUN latch 36.

As shown in the phase measurement transition diagram of FIG. 4, the latch circuit will initially be in state 1 or state 2, depending on the state of $f_C$. The latch circuit will alternate between states 1 and 2 as the clock signal changes. When a positive transition of the input data signal D is received, the TIMER RUN latch 36 will be set, enabling W. When the input signal D is received, the latch circuit will go to state 3 or 4 depending on which state it was in at the beginning.

For the early input case of FIG. 2, the transition 20 of the input data signal D is received while the latch circuit is in state 1. In state 1 all of the latches 32–40 are reset. The input data transition 20 sets the TIMER RUN latch 36 causing the state variable W to rise at 47. Setting the latch 36 takes the latch circuit to state 3. In state 3, ramp timer 41 begins operation, indicated by transition 47a in the RUN signal.

Operation of the ramp timer 41 includes generation of a ramp indicated by the dashed outline 48. The ramp 48 is the time marker that is equivalent to ½ of the nominal cycle time for $f_C$. During this time the positive transition 22 of $f_C$ will send the latch circuit from state 3 to state 4 by setting Z latch 32 and enabling Z at transition 56.

In the early input case, the reference timing period established by the ramp 48 will end prior to the negative transition 24 of $f_C$. When the ramp 48 times out, the ramp timer 41 enables T at transition 58. T will carry the latch circuit from state 4 to state 4I by setting the Y latch 38 and enabling Y a transition 60.

In state 4I, W and Y are both in their positive states, which satisfies the condition of equation (1). This raises the INC correction signal, which, as explained above, causes the charge pump 12 to raise the voltage supplied to the VCO 10 so that $f_C$ will increase in frequency. The increase in frequency will move the transitions of $f_C$ that follow transition 24 forward in time to catch up with the phase of the input data signal D.

The latch circuit will remain in state 4I for the phase difference time represented by $t_1$ until the negative transition 24 of $f_C$ sets the V latch 40, which enables V at transition 62. When V goes positive, the latch circuit transitions to state 5ID, during which the conjoint positive states of V and W satisfy equation (2), and raise the DEC signal.

In state 5ID both the INC and DEC error signals are on for the purpose explained above. In addition, the first variable term of equation (3) is satisfied, causing the standardized data output to rise at transition 64.

The latch circuit remains in state 5ID only a short time. Being in state 5ID satisfies the set conditions for the X latch 34 and raises the state variable X at transition 66. This sends the latch circuit to state 5B where it stays for a length of time equivalent substantially to the time consumed between establishing the reset conditions at the input to the TIMER RUN latch 36 and the responsive negative transition of W at 68.

Once in state 5, the INC and DEC correction signals are turned off, but the standardized data output remains on. States 5ID and 5B provide a two-gate delay for the overlap of the INC and DEC signals. As described hereinbelow, the logic structure of the latch TIMER RUN 36 is designed to make sure enough time is allowed for the latch 34 to be set well before the latch 36 begins to reset.

Assuming that the state variable F is disabled, the latch circuit will immediately transition to state 5F when the Y latch 38 is reset following the negative transition 68 of W.

Following state 5F, the positive transition 25 of $f_C$ will reset the Z latch 32, causing Z to reset at transition 72. This carries the latch circuit to state 6F, whence it exits with the negative transition 74 of $f_C$, which resets V by resetting the V latch 40. This moves the latch circuit to state 7. Immediately after entering state 7, the standardized output pulse will fall because V is in a negative state, which disables the variable terms in equation (3). From state 7, the transition back to state 1 will occur if or when input D is down. If D is still positive, the apparatus will oscillate between states 7 and 8 in response to transitions in $f_C$ until D assumes a negative condition. When D is negative the X latch 34 will be reset, returning the apparatus to standby conditions 1 and 2. The latch circuit is now ready to make another cycle when another positive transition of the input data D is received.

In the late input case of FIG. 2, the transition 26 of D will be received while the latch circuit is in state 2 since the transition 26 was preceded by the positive transition 28 of $f_C$. When the transition 26 of D is received, the latch circuit goes to state 4 by setting the TIMER RUM latch 36, which enables the state variable W. As in the early input case, the ramp timer 41 begins to run. Next, $f_C$ has a negative transition 30 while the ramp of the ramp timer is still rising and before the end of the reference timing period. This sets the V latch 40, which causes the latch circuit to transition to state 5D.

In state 5D the ramp continues to slew, the standardized data output is activated, and the DEC signal goes to a true state. This causes the charge pump to remove charge from the LPF 13 so as to reduce the frequency of $f_C$.

The latch circuit will remain in state 5D for a time equal to the phase error between the input data D and the clock $f_C$ represented by $t_2$ in FIG. 2.

When the ramp timer completes its period and posts the timeout signal T, the Y latch 38 is set, which moves the latch circuit to state 5ID. From this point, the latch circuit will perform as described above for the early input case.

An advantageous feature of the apparatus 16 is that the ramp timer 41 is controlled by state variable W. This enables the apparatus to produce an INC or DEC signal by enabling a respective one of gates 42 or 44 by a change in state of W, and then producing the signal by a change in state of Y or V. For example, the INC correction signal rises when the variables W and Y are positive. The TIMER RUN latch is always set first so that an INC sequence, represented by the transition from state 4 to state 4I, always begins by setting only the state variable Y through the Y latch 38. The DEC correction signal is caused by W and then V both being set. Again, the variable W is always set first so the DEC frequency transition from state 4 through state 5D is initiated solely by setting V.

Both the INC and the DEC correction signals are disabled when the variable W is reset. This provides a balance in the phase measurement performed by the apparatus 16 that reduces the offset that can be introduced by logic.

Another desirable feature of the apparatus of the invention is the effect of the state variables V and Y on the provision of the INC and DEC signals. In an early input case, correction begins when Y is set. Correction ends when V is set. The correction ends because both the DEC and INC signals are set. This permits both the charging and discharging current sources to remain on long enough for the decrease current source to stabilize, at which point both INC and DEC signals are disabled by resetting the variable W. In the case of a late input, the discharge current source is switched on when the variable V is set. The decrease current source operates and reduces the frequency of $f_C$ until the correction period is ended by turning on the charging current source by setting the variable V. Again, both current sources are left on until the W variable is reset. Thus one can see that either an INC or a DEC correction period is determined by the setting of the V and Y latches. This means that variation in the time required to set either latch will affect both the increase and decrease corrections equally.

The standardized data output by the data decoder 46 is synchronized with a negative transition of $f_C$ when a phase measurement cycle is nearly complete because it is enabled by the V latch 40, which is always set by the negative transition of $f_C$ that provides the measurement of the phase difference between D and $f_C$. It should be evident to one skilled in the art that the standardized data output is delayed by two elements, the latch 40 and the DECODE gate 46. The output data is standardized by the variable V because V is always reset by the next negative transition of $f_C$ following the negative transition that set it. Thus, it persists for precisely 1 cycle of $f_C$.

For example, with reference to FIG. 2, the negative transition 24 of $f_C$ enabling the measurement of a phase difference between transitions $f_C$ and D sets V at 62. Following the setting of V at 62, the standardized data output is set at 64 and remains high until V is reset by the negative transition 74 of $f_C$. Thus, even if the frequency, and thus the phase, of $f_C$ has changed in response to a phase correction signal, the location and duration of the standardized data resulting from the phase measurement is always the same with respect to $f_C$. Inspections of the late input case in FIG. 2 will show the same relationship between the standardized data output and the negative transitions 30 and 76 of $f_C$. Thus the information in the positive edges 20 and 26 of the input data signal D is carried into the standardized data output which is standardized in location and duration with respect to $f_C$.

Figure 5:
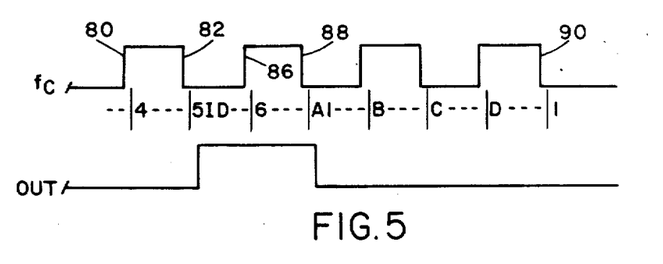
FIG. 5 is a waveform diagram illustrating a mode of operation of the phase discriminator and data standardizer used when synchronizing to a new input data source of a known frequency.

Returning to the transition diagram of FIG. 4 and regarding the timing diagram of FIG. 5, it will be seen that the return path in the transition diagram from state 5 will vary if the state variable F is set. This variation in the return path enables a special data asymmetry protection function of the apparatus 16 that permits the apparatus to perform phase detection on specialized data that is typically encountered when first synchronizing to a field of data on a magnetic disk. Such specialized data can include, for example, a repeated data pattern contained in a gap heading the data field. The embodiment of the invention illustrated in FIGS. 2, 4, and 5 is intended for a disk drive system in which the repetition rate of gap synchronizing data is ¼ of the rate of $f_C$.

The fact that the data in the gap is of known frequency can be used to prevent a false lockup condition occurring. A false lockup condition occurs when a phase-locked loop temporarily locks to input data with a phase error of 180°, which can occur if the input signal has bit pairing. As is known, when 180° false lockup occurs, input data pulses will have an apparent phase error that alternates on successive input pulses between very early and very late. Further, the input data pulses will alternately appear to be separated by one less clock cycle and then one more clock cycle than is actually the case: in fact, the pulses are separated by a constant number of clock cycles. Although false lockup is not a stable condition, it can increase the time needed for a phase-locked loop to achieve phase alignment.

The data asymmetry variable F represents a signal that would be produced, for example, when detection circuitry in a disk file controller detects the presence of a gap. Since the apparatus of the invention is expecting gap data that has ¼ the frequency of $f_C$, the apparatus, when enabled by the F variable, will prevent a false lockup by not permitting the phase discrimination function of the apparatus to react to an input data transition that is spaced closer to the previous input transition by less than 4 pulses of $f_C$. This will prevent the phase-locked loop of FIG. 1 from locking up 180° out of phase. When F is enabled, the transition cycle of FIG. 5 will detour to state A1 from state 6, and the return to state 1 will be delayed by an additional two cycles of $f_C$. While performing the function of preventing 180° phase lockup, the apparatus will continue to perform phase measurement and data standardization on the incoming data bits that are not masked by F.

Therefore, assuming a positive transition in the incoming data D that results from the detection of a gap transition that, together with the transition 80 of $f_C$ in FIG. 5, initiates a phase measurement cycle, the latch circuit will transition to state 4 as described above without regard to the state of F. Then, transition 82 of $f_C$ will carry the latch circuit to state 5ID through either state 4I or 5D. The standardized data output OUT will go positive following transition 82 as described above. Automatic transitions through state 5B to state 5 will follow, after which the positive state of F will carry the latch circuit to transition to state 6, rather than to state 5F, after the positive transition 86 of $f_C$.

From state 6, the transition cycle will prevent the latch circuit from responding to any positive transitions of D for two more cycles of $f_C$. Thus, from state 6 the cycle will enter state A1 after the negative transition 88. Since the negative transition 88 resets V, neither of the variable terms in equation (3) can be true, the DATA DECODE gate 46 is turned off and the standardized data pulse OUT is disabled in state A1.

As inspection of FIG. 4 shows, the succession of states from A1 to 1 is made in response to the transitions of $f_C$ following 88 and ending with 90. None of the states traversed in this loop permits the TIMER RUN latch to response to a transition of D and begin a measurement cycle. The first state wherein the TIMER RUN latch is able to respond is in state 1, the state in which the F loop terminates.

An additional loop in the transition cycle of FIG. 4 is between states 7 and 8. When the disk file system changes from a read to a write function, the disk file controller will inhibit the operation of the apparatus of the invention by enabling the RESET signal R. If the latch circuit is in states 1 or 2, when R is set, it will change to either state 7 or to state 8, respectively. The latch circuit will alternate between states 7 and 8 without taking any other action until R is disabled and no input data signal is present.

It should be evident that the logic states described hereinabove are not the only ones that can be assumed by the latch circuit. Other states and other variations of the transition loop of FIG. 4 are possible. Indeed, it would behoove a designer to provide for those other states and transitions when implementing the apparatus of the invention. If the latch circuit should enter one of the states not discussed herein under a set of conditions not described, it would be necessary to provide an escape path that would permit the latch circuit to transition back to one of the states illustrated in FIG. 4. Design of such escape paths or alternate routes is well within the competence of any reasonably skilled logic designer, and the logic equations of Table II provide such escape routes.

Although a variety of circuit technologies exist for implementing the latches 32-40 and 46 and the gates 42 and 44, the inventor has found that conventional differentially-coupled cascaded emitter coupled logic (CECL) provides several advantages over conventional single-ended logic circuitry such as TTL. The use of differential logic circuitry such as CECL reduces the effects of noise and other external influences in causing a variation in the delay characteristics of the latch circuits. Further, the variations due to differences between rise and fall times are reduced since every state transition involves one or more pairs of differential signals. Finally, as is known, differential logic circuits provide a better noise margin than is obtained with single-ended logic circuits. This permits smaller signal swings to be used, which results in a better speed/power product for the latch circuits.

Figure 6:
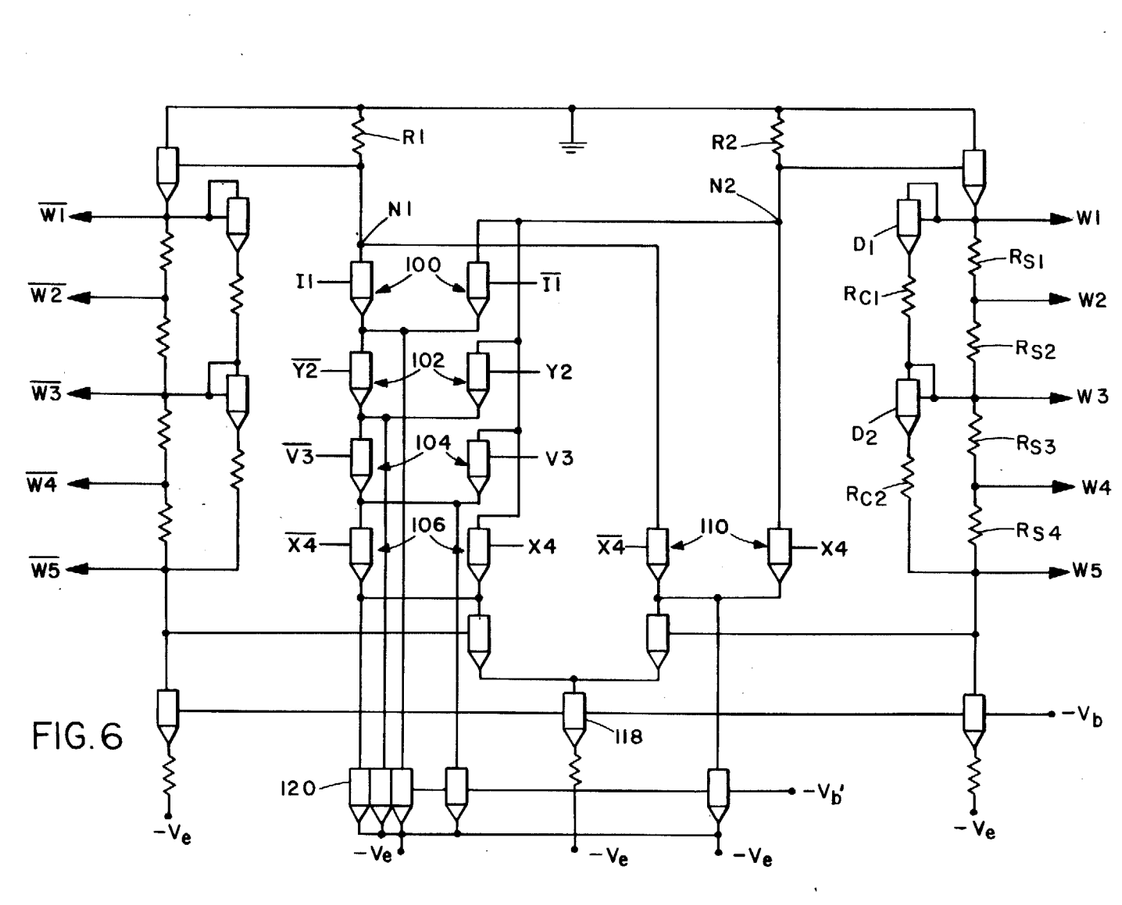
FIG. 6 is a circuit diagram illustrating a representative implementation of one latch of the phase discriminator and data standardizer of FIG. 3.

An example of implementing the latches 32-40 and 46 in CECL is provided in FIG. 6, which is a schematic representation of a CECL circuit that is functionally equivalent to the TIMER RUN latch 36. As is typical with CECL circuits, two cascaded sets of emitter coupled transistor pairs 100-106 and 110 are used to implement logic internal to the latch that will provide the response to the input state variables required to set and reset the variable W. Thus, when the latch is reset, each of the positive-sense state voltages W1, W2, W3, W4, and W5 will be at a lower voltage than the corresponding one of the negative-sense output voltages $\overline{W1}$-$\overline{W5}$. The set or reset state is determined by diversion of the current from the main current source transistor 118 through successive ones of the emitter coupled switch pairs 100-106 and 110, which are connected in such a manner as to allow a number of logical decisions to be made while only expending the dissipation of a single current path.

One further addition to the CECL circuits of the latches 32-40 and 46 is the provision of trickle current transistors, one of which is indicated by 120 in FIG. 6. Each of the trickle transistors is biased by a voltage $-Vb'$ to keep the emitter coupled transistors pair to which it is connected in a low current-on state so that, when the switch below the pair is switched to provide current, the pair will quickly pass on the current. The current from the trickle current transistors is substantially lower than the current produced by the main current source transistor. Without a trickle transistor, the node to which the emitters of a respective pair was attached could float to a voltage near the positive power supply due to minute leakage currents that are commonly found within transistor technologies. If a node were to be sitting at such a voltage when the current was switched to it, the current would have to first slew the node back to the proper operating voltage by discharging the parasitic capacitance associated with the node. This would considerably reduce the speed of the circuit and would cause the response time of the circuit to vary depending upon the length of time that had expired since it was last activated.

Of course, it is within the capability of a skilled circuit engineer to convert the state variable signals in FIG. 3 to the multi-level, differential signals required to operate CECL.

It will be noted in FIG. 6 that the variable X which resets the TIMER RUN latch is obtained from the penultimate output level (X4) of the X latch. This prevents a race between the setting of the X latch in state 5ID (which resets the RUN TIMER latch in state 5B) and the setting of the RUN TIMER latch in state 5B. As shown in FIG. 6, the X4 differential inputs are brought into the fourth input level of the RUN TIMER latch, which guarantees complete setting of the X latch before the resetting conditions of the RUN TIMER latch are present.

Obviously, many modifications and variations of this invention are possible in light of the teachings of the foregoing description. Therefore, it is to be understood that, within the scope of the following claims, the invention may be practiced in a manner that has not been specifically described.

I claim:

1. An apparatus, responsive to the difference in phase between an input data signal having transitions and a variable-frequency clock signal having transitions, for producing a phase correction signal to change the frequency of said clock signal, comprising:
   reference timing means responsive to an input data signal having transitions for producing a timing reference signal having a predetermined reference timing period;
   multi-variable circuit means responsive to said reference timing signal and to a transition of a variable-frequency clock signal for measuring a phase difference between said input data and clock signals by producing and changing a plurality of variable signals in a sequence defining a multi-state transition cycle in which each transition between adjacent states is determined by the change in one respective variable and for producing phase difference signals indicative of said measured phase difference; and
   gate means responsive to said phase difference signals for producing a phase correction signal to change the frequency of said reference clock signal.

2. The apparatus of claim 1 wherein said circuit means produces a first phase difference signal when said input data signal leads said clock signal in phase and said gate means responds to said first phase difference signal by producing a first correction signal to increase the frequency of said clock signal.

3. The apparatus of claim 1 wherein said circuit means produces a second phase difference signal when said clock signal leads said input data signal in phase and said gate means responds to said second phase difference signal by producing a second correction signal to decrease the frequency of said clock signal.

4. The apparatus of claim 1 further including standardizing means responsive to said transition cycle for providing said input data signal in a predetermined pulse width format synchronized with said clock signal.

5. The apparatus of claim 4 wherein said circuit means selectably responds to an external protection indication and to a predetermined fixed frequency data pattern in said input data signal by measuring said phase difference only once during each of a succession of multi-cycle measurement periods of said clock signal.

6. The apparatus of claim 5 wherein, in response to said predetermined fixed frequency data pattern, said circuit means measures a phase difference once every four cycles of said clock signal.

7. The apparatus of claim 1 wherein said circuit means responds to an external indication for inhibiting the operation of said apparatus and, while said apparatus is inhibited, said circuit means alternate, in response to the clock signal, between a pair of respective states of said multi-state cycle without measuring said phase difference.

8. The apparatus of claim 1 wherein said circuit means includes plural binary latches, each of said latches having a state based upon a respective group of state determinants including the state of at least one other of said latches and either the reference signal, the clock signal or the data signal.

9. The circuit of claim 8 wherein each transition of said multi-state transition cycle is caused by a change in state of only a respective one of said latches.

10. A phase discriminator and data standardizer, comprising:
    means responsive to a transition of an input data signal for producing a timing reference signal having a predetermined timing period;
    latch means responsive to said timing reference signal and to a variable-frequency clock signal for measuring the time elapsing between the end of said timing period and a predetermined portion of said clock signal by a multi-state transition cycle and for producing a time difference signal based upon said measurement;
    gate means responsive to said time difference signal for producing a correction signal to change the frequency of said clock signal to a frequency at which said measured elapsed time is reduced; and
    standardizing means responsve to said transition cycle for providing said data signal in a predetermined pulse width format synchronized with said clock signal.

11. A phase discriminator and data standardizer, comprising:
    reference timing means responsive to a multi-transition input data signal for producing a timing reference signal;
    multi-variable circuit means responsive to said reference timing signal and to a variable-frequency clock signal for measuring a phase difference between said input data and reference clock signals by producing and changing a plurality of variable signals in a sequence defining a multi-state transition cycle;
    signal means in said multi-state transition cycle for producing a phase difference signal indicative of a phase difference measured between said data and clock signals by said multi-variable circuit means;
    gate means responsive to said phase difference signal for producing a phase correction signal to change the frequency of said clock signal; and data standardizing means responsive to said transition cycle for providing said input data signal in a predetermined pulse width format synchronized with said clock signal when the frequency of said clock signal is changed.

12. The phase discriminator and data standardizer of claim 11 wherein said circuit means produces a first phase difference signal when said input data signal leads said clock signal in phase and said gate means responds to said first phase difference signal by producing a first correction signal to increase the frequency of said clock signal.

13. The phase dicriminator and data standardizer of claim 11 wherein said circuit means produces a second phase difference signal when said clock signal leads said input data signal in phase and said gate means responds to said second phase difference signal by producing a second correction signal to decrease the frequency of said clock signal.

14. The phase discriminator and data standardizer of claim 11 wherein said circuit means selectably responds to an external protection indication and to a predetermined fixed frequency data pattern in said input data signal by measuring said phase difference only once during each of a succession of multi-cycle measuring periods of said clock signal transitions.

15. The phase discriminator and data standardizer of claim 14 wherein, in response to said protection indication and said fixed frequency data pattern, said circuit means measures a phase difference only once every four cycles of said clock signal.

16. The phase discriminator and data standardizer of claim 11 wherein said circuit means responds to an external reset signal by inhibiting the operation of said phase discriminator and data standardizer and alternating between a pair of respective states of said multi-state cycle in response to the clock signal without measuring said phase difference.

17. The phase discriminator and data standardizer of claim 11 wherein said circuit means includes plural binary latches, each of said latches having a state based upon a respective group of state determinants including the state of at least one other of said latches and either the reference signal, the clock signal or the data signal.

18. The phase discriminator and data standardizer of claim 17 wherein, each transition of said multi-state transition cycle is caused by a change in state of only a respective one of said latches.

19. The apparatus of claim 17, wherein at least one of said latches includes a differential emitter-coupled circuit with a signal output network, said signal output network comprising:

a resistance ladder including a plurality of series-connected resistors, in which respective outputs of said latch are provided from connection nodes within and at either end of said series-connected resistors; and an output signal voltage-determining leg in parallel with said resistance ladder and including a plurality of series-connected segments, each segment connecting a pair of said nodes which are separated by at least one other of said nodes, and including, in series, a semiconductor element having a predetermined forward bias voltage and a resistance element, in which the combined signal voltage drop across each said segment maintains the output signal voltage at each node paralleled by said segment above a predetermined level.

20. An apparatus for synchronizing a pair of signals, comprising:

means for producing a clock signal and for changing the frequency of said clock signal in response to a phase correction signal;

a phase discriminator including timing means responsive to a multi-transition input data signal for producing a timing reference signal, multi-variable circuit means responsive to said reference timing signal and to a variable-frequency clock signal for measuring a phase difference between said input data and clock signals by producing and changing a plurality of variable signals in a sequence defining a multi-state transition cycle, signal means in said multi-state transition cycle for producing a phase difference signal indicative of a phase difference measured between said data and clock signals by said multi-variable circuit means, and gate means responsive to said phase difference signal for producing a phase correction signal to change the frequency of said clock signal; and standardizing means responsive to said transition cycle for providing said input data signal in a predetermined pulse width format synchronized with said clock signal when the frequency of said clock signal is changed.

* * * * *

UNITED STATES PATENT AND TRADEMARK OFFICE
CERTIFICATE OF CORRECTION

PATENT NO. : 4,682,121

DATED : July 21, 1987

INVENTOR(S) : Dale B. Chapman and Jack H. Chien

It is certified that error appears in the above-identified patent and that said Letters Patent is hereby corrected as shown below:

On the front page of the patent, line 2, change "Chapman" to -- Chapman et al. --, and change item [75], line 5, to read: -- Inventors: Dale B. Chapman, San Jose, California and Jack H. Chien, San Jose, California --

In column 13, insert the following paragraph after line 23 (page 27, after line 22 of the application).

-- Finally, the outputs $W_1 - W_5$ and $\overline{W_1} - \overline{W_5}$ are fed to the latches 32, 34, 38, and 40 through emitter-coupled transistor pairs such as the pairs 100-106 in Figure 6. These outputs can be understood by observing the right-hand side of the Figure 6 latch where the outputs $W_1 - W_5$ are developed. Since $W_1 - W_5$ represent the positive phase of the complementary output signals provided by the latch 36, they will be referred to as the positive phase outputs. Inspection of Figure 6 will show that the positive phase outputs are developed across an output signal network including an output resistance ladder comprising resistors $R_{S1} - R_{S4}$ in parallel with an output signal voltage-determining network leg. The positive phase outputs are developed at $W_1 - W_5$ as a result of the series connections of the output resistors. The output signal voltage-determining network leg is provided in parallel with the output resistance ladder and consists of two segments, each consisting of a diode-connected transistor connected in series with a resistor. Thus, the first segment includes the transistor $D_1$ in series with the resistor $R_{C1}$, while the second segment consists of the transistor $D_2$ connected in series with the resistor $R_{C2}$. The output network

UNITED STATES PATENT AND TRADEMARK OFFICE
CERTIFICATE OF CORRECTION

PATENT NO. : 4,682,121

DATED : July 21, 1987

INVENTOR(S) : Dale B. Chapman and Jack H. Chien

It is certified that error appears in the above-identified patent and that said Letters Patent is hereby corrected as shown below:

including the output resistance ladder and the voltage-determining network leg is connected in series with one of the current source transistors 118. Each segment of the voltage-determining network leg establishes a voltage drop across the portion of the output resistance ladder with which it is connected in parallel that consists of the base-to-emitter voltage of the transistor and the voltage drop across the resistor $R_C$. Thus, the voltage-determining network leg segment consisting of $D_1$ and $R_{C1}$ imposes the voltage drop across the portion of the output resistance ladder consisting of the resistors $R_{S1}$ and $R_{S2}$. The total voltage dropped across each portion of the output resistance ladder insures that the output signals of that portion when active, will be maintained at a voltage level which precludes saturation of the input transistor pairs in the latches 32, 34, 38, and 40. It will be evident to those skilled in the art that this voltage level will keep the input transistor pairs of those latches out of saturation. As is known, biasing a transistor at saturation will slow its response to input signal changes due to the requirement to discharge excess minority carriers. Therefore, in providing an output voltage signal level above the saturation bias level, the output network illustrated in Figure 6 assists in

UNITED STATES PATENT AND TRADEMARK OFFICE
CERTIFICATE OF CORRECTION

PATENT NO. : 4,682,121  Page 3 of 3

DATED : July 21, 1987

INVENTOR(S) : Dale B. Chapman and Jack H. Chien

It is certified that error appears in the above-identified patent and that said Letters Patent is hereby corrected as shown below:

maintaining quick response by the latches to which the output signals of the timer run latch 36 are fed. --

Signed and Sealed this

Twenty-eighth Day of June, 1988

Attest:

DONALD J. QUIGG

*Attesting Officer*          *Commissioner of Patents and Trademarks*